United States Patent [19]
Hemmenway et al.

[11] Patent Number: 5,696,452
[45] Date of Patent: Dec. 9, 1997

[54] ARRANGEMENT AND METHOD FOR IMPROVING ROOM-TEMPERATURE TESTABILITY OF CMOS INTEGRATED CIRCUITS OPTIMIZED FOR CRYOGENIC TEMPERATURE OPERATION

[75] Inventors: Donald F. Hemmenway, Melbourne; John T. Gasner, Satellite Beach; William R. Young, Palm Bay, all of Fla.

[73] Assignee: Harris Corporation, Melbourne, Fla.

[21] Appl. No.: 512,323

[22] Filed: Aug. 8, 1995

[51] Int. Cl.⁶ .................................................. G01R 31/26
[52] U.S. Cl. ........................ 324/760; 324/765; 324/769
[58] Field of Search ................................ 324/760, 765, 324/769, 766, 767, 768

[56] References Cited

U.S. PATENT DOCUMENTS

| | | | |
|---|---|---|---|
| 4,916,389 | 4/1990 | Hori et al. | 324/765 |
| 5,325,054 | 6/1994 | Houston | 324/769 |

*Primary Examiner*—Ernest F. Karlsen
*Attorney, Agent, or Firm*—Charles E. Wands

[57] ABSTRACT

Room temperature-testing of an MOS field effect transistor architecture, whose parameters have been optimized for operation at cryogenic temperatures, is facilitated by applying a prescribed reverse body-to-source voltage bias, that modifies the variation of the drain-to-source current vs. gate-to-source voltage characteristic, so as to shift the gate threshold voltage to a value corresponding to the device operating at its optimally designed cryogenic temperature. The magnitude of this back bias voltage is set at a value which adds to the number of charges required to balance the gate voltage before an inversion condition is achieved. In effect, the back bias causes the depletion layer beneath the gate to be expanded into the body beneath the gate, thereby compensating for what would otherwise be depletion mode operation, if the cryogenically designed MOS device were placed at room temperature. This allows the cryogenic performance of the MOS field effect transistor to be tested at room temperature, thereby substantially reducing manufacturing cost. Upon completion of testing of the circuit to evaluate its performance at cryogenic temperatures, the back-bias is removed, so as to allow normal operation in the circuit's intended cryogenic environment.

18 Claims, 1 Drawing Sheet

ARRANGEMENT AND METHOD FOR IMPROVING ROOM-TEMPERATURE TESTABILITY OF CMOS INTEGRATED CIRCUITS OPTIMIZED FOR CRYOGENIC TEMPERATURE OPERATION

FIELD OF THE INVENTION

The present invention relates in general to the manufacture of semiconductor circuits and devices, and is particularly directed to a scheme for improving the room-temperature testability of CMOS circuits which have been optimized for cryogenic temperature operation, but may not otherwise function satisfactorily to permit testing at room temperature.

BACKGROUND OF THE INVENTION

There are number of applications requiring the use of integrated circuits which operate at cryogenic temperatures. Non-limiting examples include signal processing circuits which are coupled to cooled infrared detectors, circuits making use of phenomena that only occur at low temperatures (e.g., superconductivity, the Josephson effect), and circuitry that is cooled in order to obtain improved performance (higher speed, lower noise, increased sensitivity, etc.). In such circuit applications, cryogenic or "low" temperatures are those significantly below the conventional temperature range (which typically ends at −55° C.). Thus, for purposes of the present description, cryogenic or low temperatures may be understood to be, but are not necessarily limited to, temperatures on the order of 100K (−173° C.) and colder.

Since the performance of integrated circuit devices can change dramatically when cooled to cryogenic temperatures, integrated circuits designed to operate at such low temperatures are commonly optimized for its intended low temperature operation. Conversely, the performance of such low-temperature-optimized circuits can be expected to change when warmed to room temperature; indeed, at room temperature, such cryogenic application-optimized circuits may even become nonfunctional.

From a practical, economic perspective, however, it is desirable that initial circuit testing to screen out defective circuits be conducted in a less costly room temperature environment, in order to minimize the need for more expensive and time-consuming cryogenic testing. Still, if circuits to be used in a cryogenic environment do not function satisfactorily, or at all, at room temperature, all testing must be carried out at a low temperature, at great expense.

CMOS devices are most commonly used for cryogenic circuit applications because their performance, in general, improves at low temperatures, whereas standard bipolar devices perform poorly under cryogenic conditions. For example, the speed and drive current of a CMOS circuit may increase several times under low temperature operating conditions, as opposed to room temperature operation, due to increased carrier mobility and saturation velocity, resulting from reduced thermal disruption of their motion.

Another very important MOS device parameter which changes with reduction in temperature is (gate-to-source) threshold voltage. Specifically, as diagrammatically illustrated in FIG. 1, the dependency of drain-to-source current (log $I_{DS}$) on variation in gate-to-source voltage ($V_{GS}$) exhibits a substantial step change from a nominal (leakage) level 11 to an elevated (turned-on) level 13 at a relatively steep threshold slope region 15, which corresponds to the gate-to-source threshold voltage $V_{TH}$. As shown by broken line 21, this MOS threshold voltage undergoes a major step change in magnitude for both n-channel and p-channel MOSFETs, as the operating temperature is decreased, the change typically being on the order of around 1–1.5 mV/K. (It should be noted that, in the present description, the magnitude or absolute value of the threshold voltage is implied, whether the device be an n-channel device (having a positive threshold) or a p-channel device (which typically has a negative threshold).

This temperature dependency of MOS threshold voltage is mainly due to an increase in band-bending as the temperature is reduced. Band-bending, in turn, is caused primarily by the temperature dependence of the intrinsic carrier concentration, $n_i$. Thus, the threshold voltage can increase several tenths of a volt or more when MOS devices are cooled to very low (cryogenic) temperatures. In addition, for devices employing counterdope implants for the purpose of adjusting threshold voltage (which is very common in p-channel MOS devices having n-type poly gate doping), freeze-out of the counterdope implant at low temperatures can further increase the low temperature threshold voltage by several tenths of a volt.

Optimum device design practice dictates that MOS threshold voltages be set as low as possible, consistent with complete turn-off of subthreshold conduction at zero gate voltage. The optimum threshold voltage for room temperature operation of 5V MOS devices is typically in the range of 0.7–1.0 volts. For low temperature operation, the increase in the speed of device turn off with respect to gate voltage (3–4X higher subthreshold slope) allows the optimum threshold voltage to be set even lower. The net result of these considerations is that optimum design of cryogenic CMOS devices places their low temperature threshold voltage at a value somewhat lower than for typical room temperature devices.

As shown by the dotted line 31 in FIG. 1, when such low-temperature-optimized devices are warmed to room temperature, the threshold voltage will be further decreased, resulting in significant off-state ($V_{GS}$=0) leakage or depletion mode behavior at room temperature. Namely, $V_{TH}$<0, with the device being on at zero gate voltage. These effects can hinder or totally preclude successful room temperature testing of circuits optimized for cryogenic temperature operation. Thus, it is desirable to have a method to compensate for the threshold voltage decrease experienced in such cryogenic circuits when tested at room temperature.

SUMMARY OF THE INVENTION

In accordance with the present invention, room temperature testing of an MOS field effect transistor architecture, whose parameters have been optimized for operation at cryogenic temperatures, is facilitated by applying an electrical stimulus to the body of the MOS transistor, in particular, by applying a prescribed reverse body-to-source voltage bias, which modifies the variation of drain current vs. gate voltage characteristic, so as to shift the gate threshold voltage to a value corresponding to the device operating at its optimally designed cryogenic temperature.

The magnitude of this back bias voltage is set at a value which adds to the number of charges required to balance the gate voltage before an inversion condition is achieved. In effect, the back bias causes the depletion layer beneath the gate to be increased or expanded into the body beneath the gate, thereby preventing (compensating for) what would otherwise be depletion mode operation, if the cryogenically designed MOS device were placed at room temperature and biased in the same manner as its designed for cryogenic operation.

3

It should be noted that back-gate biasing of a MOS device, per se, is not novel. For example, NMOS devices have commonly been used with a back-gate bias during normal circuit operation to improve performance, by allowing a more lightly doped p-well to be used, thereby providing higher carrier mobility, faster operation (lower capacitance due to wider depletion spreads) and less threshold sensitivity to biasing. However, to applicants' knowledge there has been no suggestion to use of back-biasing in the manner of the present invention to be described in detail below, for the purpose of solving the problem of how to test cryogenically designed MOS devices at room temperature.

Pursuant to the invention, a single polarity back bias may be applied to a single polarity (either p-channel or n-channel) device, or a pair of back bias voltages may be applied to a dual polarity (CMOS) device, in which respective back bias voltages $V_{BB-}$ and $V_{BB+}$ are applied for the respective polarity channel devices. In a CMOS structure, the positive n-channel threshold becomes more positive, and the negative p-channel threshold becomes more negative. The increase in threshold voltage due to the back-gate bias $V_{BB}$ is a function of both the gate oxide thickness and the background doping concentration. With such a back bias applied, since the back bias shifts the gate threshold voltage of the MOS device to a value that effectively corresponds to that of the device operating at its optimally designed cryogenic temperature, the cryogenic performance of the MOS field effect transistor can be tested at room temperature, thereby substantially reducing manufacturing cost.

In order to facilitate application of a back bias during room temperature testing, all the n-channel bodies of an integrated circuit may be tied together and accessed by way of a single bond pad for that polarity device type. Thus, for a single well CMOS configuration, the body of one or more p-channel devices may be simply the n substrate on which a single access bonding pad is formed. In addition to providing externally accessible back bias voltage-applying pads for room temperature testing, described above, other mechanisms may be employed to achieve the same threshold voltage-shifting effect. For example, internal circuitry of the chip in which the CMOS devices to be tested, may be employed to provide the necessary back-gate bias potentials; alternatively multiple bias levels may be used for different devices.

DETAILED DESCRIPTION

As pointed out briefly above, the methodology of the present invention facilitates testing of a semiconductor circuit device, such as an MOS field effect transistor architecture, in particular, one whose configuration and operational parameters have been tailored or optimized for operation at a condition such as a cryogenic temperature environment, which is other than a condition (e.g. room temperature) that not only facilitates testing of the device, but which may cause the device to depart substantially from its intended performance envelope and even become non-functional.

In particular, the invention involves the application of an electrical stimulus to an MOS field effect transistor, the electrical stimulus being in the form of a prescribed reverse body-to-source voltage bias, that modifies the variation of drain current with gate voltage characteristic, such that the gate threshold voltage of the MOS device effectively corresponds to that corresponding to the device operating at its optimally designed cryogenic temperature. Applying such a back bias between the body and the source enables the MOS field effect transistor to be tested at room temperature, yet providing an evaluation of the performance of the field effect transistor at its intended cryogenic operating temperature. Upon completion of testing of the circuit to evaluate its performance at cryogenic temperatures, the back-bias is removed, so as to allow normal operation in the circuit's intended cryogenic environment.

Figure 2:
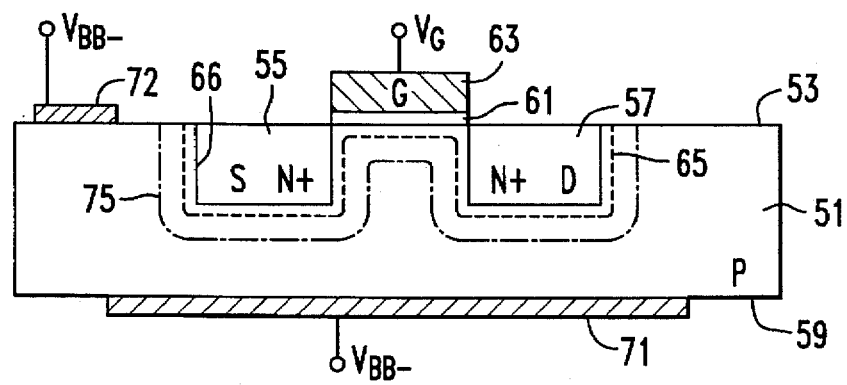
FIG. 2 diagrammatically illustrates a cross-section of an N-channel MOS field effect transistor architecture, in which a reverse source-body voltage is applied through an electrode layer on the back side of the body in accordance with an embodiment of the invention, so as to shift the gate threshold voltage to that corresponding to the device operating at its optimally designed cryogenic temperature.

The methodology of the present invention may be readily understood with reference to FIG. 2, which diagrammatically illustrates a cross-section of an N-channel MOS field effect transistor architecture having a P-type semiconductor body or substrate 51, in spaced apart portions of a top surface 53 of which respective N+ source and regions 55 and 57 are formed. A gate insulator layer 61 overlies the surface of the substrate 51 between the source and drain regions 55 and 57, respectively, and has a conductive layer 63, such as doped polysilicon, formed thereon, to provide a gate electrode overlying the gate insulator layer 61. The broken lines 65 around the source and drain regions 55 and 57 and beneath the surface of the gate represent depletion regions that are formed due to the gate oxide charge and conventional bias applied to the device.

Figure 1:
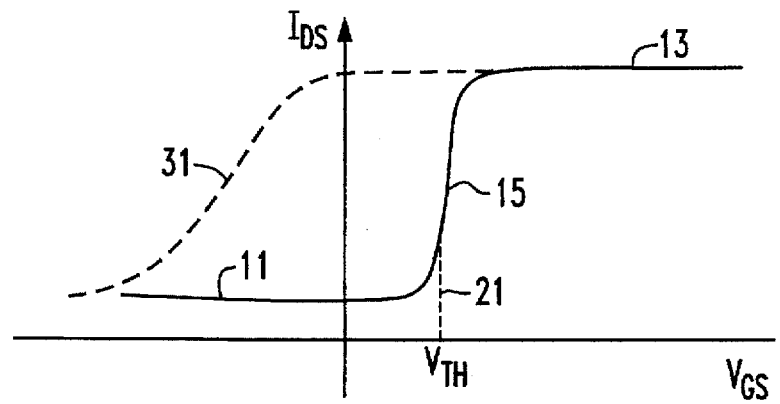
FIG. 1 diagrammatically illustrates the dependency of drain-to-source current (log $I_{DS}$) on variation in gate-to-source voltage ($V_{GS}$) of an MOS field effect transistor.

As a non-limiting example of an enhancement mode MOS device that is optimized for operation at cryogenic temperatures, the doping parameters of such a device are typically established to provide a gate threshold voltage that is increased substantially relative to that of a room temperature device which, for a typical 5V MOS device, lies in the range of 0.7–1.0 volts, as diagrammatically illustrated in the drain current vs. gate threshold voltage characteristic of FIG. 1, described above. If the temperature of the device is elevated to room temperature, however, the threshold voltage is shifted or decreased to its value shown by the broken lines 31, causing the transistor to exhibit depletion mode behavior, resulting in significant off-state ($V_{GS}=0$) leakage.

Pursuant to the invention, a reverse bias voltage is applied to the source-body junction 66, for example, by coupling a reverse (back) bias voltage $V_{BB}$ to the body 51 of the MOS device by means of an electrode layer 71 that is formed on the back side 59 of the body 51, or by means of an electrode layer 72 that is formed on the front side 53 of the body 51. The magnitude of this back bias voltage $V_{BB}$ is set at a value which adds to the number of charges required to balance the gate voltage before an inversion condition is achieved. In effect, the back bias causes the depletion layer beneath the gate to be increased or expanded from the region denoted by broken lines 65 to a region denoted by the dot-dash lines 75. As a non-limiting example, for the case of a typical 5V MOS device intended to operate in a cryogenic temperature range less than 100K, with a cryogenic operational threshold voltage on the order of 0.1 to several tenths of a volt, the magnitude of the back bias voltage employed for room temperature testing may lie in a range on the order of 2–5 volts.

Figure 3:
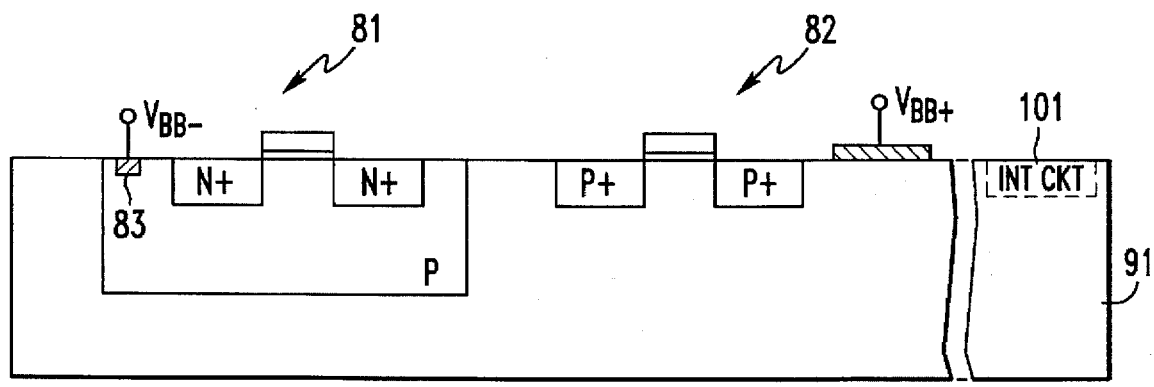
FIG. 3 diagrammatically illustrates a CMOS structure in which a pair of back bias voltages $V_{BB-}$ and $V_{BB+}$ are applied for respective opposite polarity channel devices.

A single polarity back bias may be applied to a single polarity (either p-channel or n-channel) device, such as the n-channel device of FIG. 2, or a pair of back bias voltages may be applied to a dual polarity (CMOS) device, for example, that diagrammatically illustrated in FIG. 3, in which respective back bias voltages $V_{BB-}$ and $V_{BB+}$ are applied for the respective polarity channel devices 81 and 82. In a CMOS structure, the positive n-channel threshold becomes more positive, and the negative p-channel threshold becomes more negative. The increase in threshold voltage due to the back-gate bias $V_{BB}$ is a function of both the gate oxide thickness and the background doping concentration. With such a back bias applied, the device can now be tested at room temperature, since the back bias shifts the gate threshold voltage of the MOS device to a value that effectively corresponds to that of the device operating at its optimally designed cryogenic temperature, so that the cryogenic performance of the MOS field effect transistor can be tested at room temperature, thereby substantially reducing manufacturing cost. Upon completion of testing of the circuit to evaluate its performance at cryogenic temperatures, the back-bias is removed, so as to allow normal operation in the circuit's intended cryogenic environment.

In order to facilitate application of a back bias to the MOS body during room temperature testing requires access to the body, all the n-channel bodies of an integrated circuit may be tied together and accessed by way of a single bond pad, such as the bonding pad 83 for the n-channel device 81 of a multiple n-channel device architecture, and the bonding pad 84 for the p-channel device 82 of a multiple p-channel device architecture of the CMOS structure of FIG. 3. Thus, for the single well CMOS configuration of FIG. 3, the body of one or more p-channel devices 82 is simply the substrate 91 on which the bonding pad 84 is formed.

In addition to providing externally accessible back bias voltage-applying pads for room temperature testing, described above, other mechanisms may be employed to achieve the same threshold voltage-shifting effect. For example, internal circuitry of the chip in which the CMOS devices to be tested, shown diagrammatically at 101 in FIG. 3, may be employed to provide the necessary back-gate bias potentials; alternatively multiple bias levels may be used for different devices.

As will be appreciated from the foregoing description, room temperature testing of an MOS field effect transistor architecture, whose parameters have been optimized for operation at cryogenic temperatures, is facilitated in accordance with the present invention by applying a prescribed reverse body-to-source voltage bias, that shifts the gate threshold voltage to a value corresponding to the device operating at its optimally designed cryogenic temperature, thereby preventing what would otherwise be depletion mode operation, if the cryogenically designed MOS device were tested at room temperature without the back bias. This allows the cryogenic performance of the MOS field effect transistor to be tested at room temperature, thereby substantially reducing manufacturing cost.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A method of testing a semiconductor circuit device comprising the steps of:
   (a) providing a semiconductor circuit device which, during normal operation, is to be used at a first temperature;
   (b) placing said semiconductor circuit device at a second temperature, different from said first temperature at which said semiconductor device is to be used;
   (c) applying a prescribed stimulus, that is exclusive of a stimulus normally applied at said first temperature, to said semiconductor device as placed at said second temperature in step (b), so as to cause said semiconductor device to behave as though said semiconductor device were at said first temperature; and
   (d) conducting a test of said semiconductor circuit device during the application of said prescribed stimulus of step (c), so as to obtain an evaluation of the performance of said semiconductor device at said first temperature.

2. A method according to claim 1, wherein said first temperature is lower than said second temperature.

3. A method according to claim 1, wherein said second temperature corresponds to room temperature.

4. A method according to claim 3, wherein said first temperature corresponds to a cryogenic temperature.

5. A method according to claim 1, wherein said semiconductor device comprises an insulated gate field effect transistor having a body, a source, a drain and a gate, and wherein step (c) comprises applying a prescribed reverse voltage bias to said body relative to said source, that increases the gate threshold voltage of said field effect transistor to a value as through said field effect transistor were at said first temperature.

6. A method according to claim 1, wherein said semiconductor device comprises a CMOS field effect transistor structure, that includes a first field effect transistor having a body, a source, a drain and a gate, and wherein step (c) comprises applying a prescribed reverse voltage bias to said body relative to said source, that increases the gate threshold voltage of said first field effect transistor to a value as through said first field effect transistor were at said first temperature.

7. A method of testing a semiconductor circuit device comprising the steps of:
   (a) providing a semiconductor circuit device which, during normal operation, is to be used at a first temperature;
   (b) placing said semiconductor circuit device at a second temperature, different from said first temperature at which said semiconductor device is to be used;
   (c) applying a prescribed electrical stimulus to said semiconductor device that causes said semiconductor device to behave as though said semiconductor device were at said first temperature; and
   (d) conducting a test of said semiconductor circuit device during the application of said prescribed electrical stimulus of step (c), so as to obtain an evaluation of the performance of said semiconductor device at said first temperature.

8. A method according to claim 7, wherein operational condition corresponds to a first temperature, and said second operational condition corresponds to a second temperature, and wherein step (b) comprises placing said semiconductor circuit device at said second step (c) comprises applying a prescribed electrical voltage bias to said semiconductor device at said second temperature, that causes an attribute of said semiconductor device to behave as though said semiconductor device were at said first temperature.

9. A method according to claim 8, wherein said first temperature is lower than said second temperature.

10. A method according to claim 8, wherein said second temperature corresponds to room temperature.

11. A method according to claim 10, wherein said first temperature corresponds to a cryogenic temperature.

12. A method according to claim 8, wherein said semiconductor device comprises an insulated gate field effect transistor having a body, a source, a drain and a gate, and wherein step (c) comprises applying a prescribed reverse voltage bias to, said body relative to said source, that increases the gate threshold voltage of said field effect transistor to a value as through said field effect transistor were at said first temperature.

13. A method according to claim 8, wherein said semiconductor device comprises a CMOS field effect transistor structure, that includes a first field effect transistor having a body, a source, a drain and a gate, and wherein step (c) comprises applying a prescribed reverse voltage bias to said body relative to said source, that increases the gate threshold voltage of said first field effect transistor to a value as through said first field effect transistor were at said first temperature.

14. A method according to claim 8, wherein said semiconductor device comprises a field effect transistor having a body, a source, a drain and a gate, and wherein (b) comprises placing said semiconductor circuit device at room temperature, step (c) comprises applying a prescribed reverse voltage bias to said body relative to said source, that increases the gate threshold voltage of said field effect transistor to a value as through said field effect transistor were at a cryogenic temperature, and step (d) comprises conducting a test of said field effect transistor during the application of said prescribed reverse voltage bias in step (c), so as to obtain an evaluation of the performance of said field effect transistor at said cryogenic temperature.

15. A semiconductor circuit architecture comprising a semiconductor body containing a semiconductor device whose parameters have been established for operation at cryogenic temperatures, but which, if operated under the same biasing conditions at room temperature, would not function as designed, and a circuit arrangement that is operative to apply a prescribed voltage bias to said semiconductor body at room temperature, which prescribed voltage bias modifies the variation of an electrical characteristic of said device to a value corresponding to the device operating at its designed cryogenic temperature, thereby allowing the performance of said semiconductor device for cryogenic temperature operation to be evaluated at room temperature.

16. A semiconductor circuit architecture according to claim 15, wherein said semiconductor device comprises an MOS field effect transistor having a body containing source and drain regions, and an insulated gate overlying a channel region of said body between said source and drain regions, and wherein said prescribed voltage bias comprises a back body bias, which reverse-biases a junction between said body and said source region, so as to modify drain-to-source current vs. gate-to-source voltage characteristics of said MOS field effect device and shift the gate threshold voltage to a value corresponding to MOS device operation at said cryogenic temperature, and thereby prevent depletion mode operation, were said MOS field effect device operated at room temperature at the same biasing conditions employed for cryogenic operation.

17. A semiconductor circuit architecture according to claim 15, wherein said semiconductor circuit device comprises a CMOS field effect transistor architecture, wherein body portions of a plurality of common polarity channel MOS devices are electrically tied together, and wherein said circuit arrangement comprises one or more bond pads through which back biasing of said common polarity channel MOS devices is effected.

18. A semiconductor circuit architecture according to claim 15, wherein said semiconductor circuit device comprises a CMOS field effect transistor architecture, wherein body portions of a plurality of common polarity channel MOS devices are electrically tied together, and wherein said circuit arrangement comprises an internal circuit of said body, exclusive of said common polarity channel MOS devices, which is connected to supply said prescribed voltage bias to said electrically tied together common polarity channel MOS devices at room temperature.

* * * * *